United States Patent
Rubtsov et al.

(10) Patent No.: US 10,241,212 B2
(45) Date of Patent: Mar. 26, 2019

(54) METHODS AND RECEIVERS FOR PROCESSING GNSS SIGNALS

(71) Applicant: Topcon Positioning Systems, Inc., Livermore, CA (US)

(72) Inventors: Dmitry Anatolyevich Rubtsov, Moscow (RU); Andrey Vladimirovich Veitsel, Moscow (RU); Igor Anatolyevich Orlovsky, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 405 days.

(21) Appl. No.: 15/101,468

(22) PCT Filed: Feb. 19, 2016

(86) PCT No.: PCT/RU2016/000092
§ 371 (c)(1),
(2) Date: Jun. 3, 2016

(87) PCT Pub. No.: WO2017/142434
PCT Pub. Date: Aug. 24, 2017

(65) Prior Publication Data
US 2018/0038964 A1    Feb. 8, 2018

(51) Int. Cl.
*G01S 19/33* (2010.01)
*G01S 19/37* (2010.01)
*H03D 7/00* (2006.01)

(52) U.S. Cl.
CPC .............. *G01S 19/33* (2013.01); *G01S 19/37* (2013.01); *H03D 7/00* (2013.01)

(58) Field of Classification Search
CPC .................................. G01S 19/33; G01S 19/37
See application file for complete search history.

(56) References Cited

U.S. PATENT DOCUMENTS

| | | | | |
|---|---|---|---|---|
| 4,578,678 A | * | 3/1986 | Hurd | G01S 19/29 342/357.25 |
| 6,526,322 B1 | * | 2/2003 | Peng | G01S 19/24 342/357.68 |

(Continued)

FOREIGN PATENT DOCUMENTS

WO    96/37789 A1    11/1996

OTHER PUBLICATIONS

Search Report in PCT/RU2016/000092, dated Nov. 17, 2016.

*Primary Examiner* — Gregory C. Issing
(74) *Attorney, Agent, or Firm* — Bardmesser Law Group

(57) ABSTRACT

A method for receiving and processing satellite navigation signals includes receiving the navigation signals; converting the navigation signals into digital signals; providing a clock signal to all channels that process the digital signals; generating frequency division signals; selecting a channel frequency division signal from the frequency division signals based on which ADC is used to convert the satellite navigation signals into digital signals; connecting the channel to the ADC; generating code frequency signal and base carrier frequency signal using a net accumulation signal; processing the digital signal in the channel to produce digital quadrature signal components of the digital signal based on the code frequency signal and the base carrier frequency signal; using a tick signal that represents $2^N \times$clock signal as a temporary time scale for control of the channels for determining digital signal phase differences between the channels; and outputting coordinates based on the quadrature components.

16 Claims, 15 Drawing Sheets

(56) References Cited

U.S. PATENT DOCUMENTS

| | | | |
|---|---|---|---|
| 7,222,035 B1 | 5/2007 | Zhodzishsky et al. | |
| 7,551,127 B2* | 6/2009 | Dubash | G01S 19/32 |
| | | | 342/357.72 |
| 7,764,226 B1* | 7/2010 | Veitsel | G01S 19/37 |
| | | | 342/357.73 |
| 9,020,088 B2* | 4/2015 | Zhodzishsky | H03L 7/085 |
| | | | 327/149 |
| 9,482,760 B2* | 11/2016 | Lennen | G01S 19/33 |
| 2008/0071995 A1* | 3/2008 | Chen | G01S 19/33 |
| | | | 711/147 |

\* cited by examiner

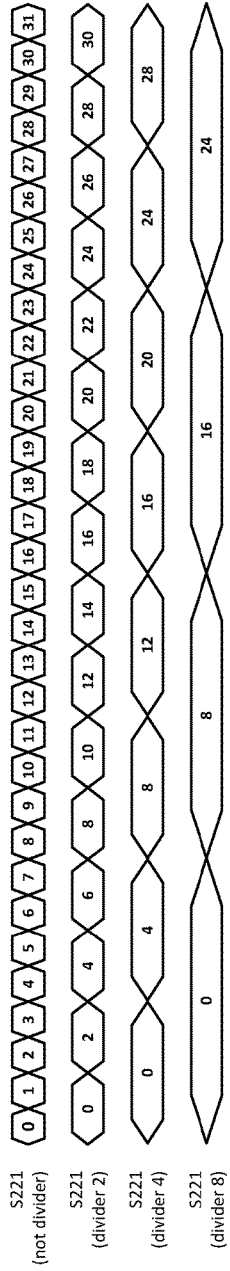
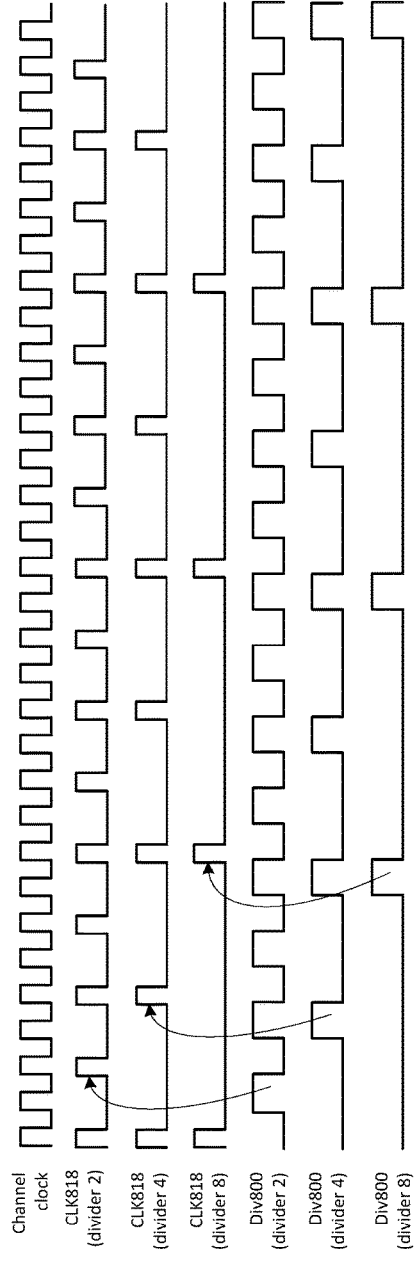
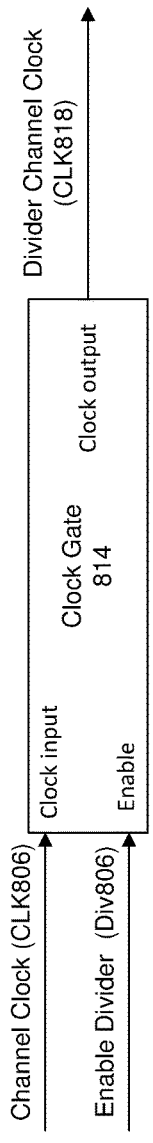
FIG. 10
FIG. 12
FIG. 11

METHODS AND RECEIVERS FOR PROCESSING GNSS SIGNALS

BACKGROUND OF THE INVENTION

Field of the Invention

The invention relates to receivers and methods for processing satellite navigation signals from different systems (GPS, GLONASS and GALILEO).

Description of the Related Art

Typical known receivers can have a configuration with at least four channels (FIG. 1A), or an extended configuration with P channels (FIG. 1B).

A receiver with four channels can process signals from four satellites, and a receiver with P channels can process signals from P satellites.

The known receivers contain (see FIGS. 1A, 1B):
- 101—an antenna;
- 102—an RF-path;
- 103—an analog-digital converter (hereafter ADC);
- 104—a standard channel;
- 105—a processor;
- 106—a communications module;
- 107—a user;
- 108—a time scale generator.

Such a conventional receiver is used as follows: Before receiver operation, the processor 105 adjusts a time scale generator. The time scale generator 108 generates a signal S309 (tick) with equal time instants.

The satellite signal is fed to antenna 101, passes through the RF-path 102, the ADC 103 and arrives at the channel 104. The channel 104 processes the signal from ADC 103. The time scale generator 108 generates a clock cycle (tick). The processor 105 controls the standard channel 104. The processor 105 also processes some information from the channels 104 when the tick signal S309 is available, and through communications module 106 transmits the data to the user 107.

A time scale generator, shown in FIG. 2 includes:
- 300—an accumulator;
- 301—a tick register;
- S302—a tick register reset signal;
- 303—a threshold unit (storing the threshold);
- 304—a generator of a net accumulator;
- S305—a sum signal;
- S306—a value of the tick register;
- S307—a threshold unit signal;
- S308—a net accumulator signal;
- S309—a tick.

The time scale generator generates the tick S309 and net accumulator signal S308. The tick signal S309 is a multiple of $2^N$ channel clocks. The tick signal S309 is used as a signal of the receiver time scale.

Signals from the net accumulator are used in code frequency generators 202, and the carrier generator signal 201 is used in the channel 104.

Before control of the channel 104 starts, the processor 105 writes a threshold into the threshold unit 303. The processor 105 sends a reset signal to the tick register S302. The tick register reset signal S302 resets the tick register to zero.

Further, each channel clock from the tick register S306 is fed to accumulator 300, net accumulator generator 304 and threshold unit 303. In accumulator 300, a unit is added to the value of tick register S306. Sum signal S305 from accumulator 300 is fed to tick register 301 and net accumulator generator 304. Threshold unit 303 compares the given threshold with the value from tick register 301, and if they match, a threshold unit signal S307 is outputted. Signal S307 is fed to net accumulator generator 304 and tick register 301. The tick register 301 is reset to zero according to the signal S307.

A net accumulator generator 304, shown in FIG. 3A, includes:
- 400—an inverter;
- 401—"AND" addition operation;
- 402—a net accumulator register;
- 403—a register of threshold unit signal;
- S308—a net accumulator signal;
- S309—a tick signal.

The following signals are fed to the net accumulator generator 304:
- A threshold unit signal S307;
- A sum signal S305;
- A value from the tick register S306.

The number from tick register S306 and the sum signal S305 have N bits, where the first bit is the lowest bit and $N^{th}$ bit is the highest bit. Each bit of the tick register S306 is fed to its inverter 400. To produce the addition operation 401, the signal from inverter 400 and the sum signal S305 are used (these signals have the same number as the number of the addition operation 401). The signals from block 401 are fed to net accumulator registers 402. A signal of net accumulator S308(N) is outputted from the net accumulator register 402(1). After that, a signal of net accumulator S308(N−1) is outputted from the net accumulator register 402(2). And, respectively, the signal of net accumulator S308(1) is outputted from the net accumulator register 402(N).

The threshold unit signal S307 is fed to the threshold unit register 403. From block 403, the tick signal S309 is outputted. Tick signals S309 and S308 are fed to the channels 104 and processor 105.

FIG. 3B presents an example of operating the net accumulator signal S308 and tick signal S309.

where:
- signal S308(N) occurs each second channel clock;
- signal S308(N−1) occurs each 4-th channel clock;
- signal S308(N−2) occurs each 8th channel clock;
- signal S308(1) occurs each 16-th channel clock;
- signal S309 occurs each N-th channel clock.

At each channel clock, only one of signals S308 and ticks S309 can occur.

Conventional receiver channels include (see FIG. 4):
- 200—an input switch;
- 201—a carrier generator;
- 202—a code frequency generator;
- 203, 216—a block of quadrature carrier phase;
- 204, 205, 206, 217—multipliers-accumulators;
- 207, 208, 209, 219—channel buffers;
- 210, 218—a strobe generator;
- 211—a code generator;
- 212—a generator of accumulation period;
- S213—a code rate;
- S214—an accumulation period;
- S215—a code sequence;
- S220—a code phase signal;
- S221—data from input switch 200.

Before the receiver starts, the standard channel 104 needs to be adjusted (initiated) to process signals. Depending on the processed signals the following steps should be executed:

a desirable ADC 103 output is selected by the input switch 200;

a desirable carrier frequency is assigned in the carrier generator 201;

a desirable frequency of the code sequence is assigned in the frequency generator 202;

the code generator 211 is adjusted;

the strobe generators 210, 218 are adjusted;

the accumulation period generator 212 is adjusted.

The standard channels are used as follows: after initialization according to the tick signal S309, the carrier generator 201 and the code frequency generator 202 start to run.

The carrier generator 201 generates a carrier phase, which is further shifted by 90 degrees in quadrature carrier phase blocks (203 and 216).

The code frequency generator 202 generates the code rate signal S213 and the code phase signal S220.

Accumulation period generator 212 generates accumulation period signal S214 at code rate S213.

Code generator 211 generates code sequence S215 at code rate S213. Code phase signal S220 is fed to strobe generators 210 and 218. A signal from code generator 211 is fed to strobe generators 210 and 218, where strobe is generated.

Signal S211, data from input switch 200, carrier generator 201, quadrature carrier phase block 203 and 216, strobe generators 210 and 218, code generator 211 are multiplied and stored over accumulation period S214 in multipliers-accumulators 204, 205, 206, 217.

The values stored over the accumulation period in are written in channel buffers 207, 208, 209, 219.

In processing the input signal in the standard channel 104, the processor 105 can change the following (if needed):

code rate and phase in code rate generator 202;

carrier frequency and phase in carrier generator 201;

accumulation period in accumulation period generator 212;

strobes in strobe generators 203, 218;

updating mode for code rate generator 202;

updating mode for carrier generator 201.

In addition, the following can be read from the processor 105:

code phase from the code rate generator 201;

carrier phase from the carrier generator 202;

a state of the accumulation period generator 212;

numbers in the channel buffers 207, 208, 209, 219;

availability of the accumulation period signal S214 over the latest time interval between tick signals S309.

SUMMARY OF THE INVENTION

The present invention relates to GNSS receivers, and more particularly, to a system and method for processing GNSS signals at different clock rates and generating different clocks that substantially obviates one or more of the disadvantages of the related art.

In one aspect of the invention, a method for receiving and processing satellite navigation signals includes receiving the satellite navigation signals; converting the satellite navigation signals into digital signals; providing a clock signal to all channels that process the digital signals; generating frequency division signals; selecting a channel frequency division signal from the frequency division signals based on which Analog-to-Digital Converter is used to convert the satellite navigation signals into digital signals; connecting the channel to the Analog-to-Digital Converter; generating code frequency signal and base carrier frequency signal using a net accumulation signal; processing the digital signal in the channel to produce digital quadrature signal components of the digital signal based on the code frequency signal and the base carrier frequency signal; using a tick signal that represents $2^N \times$clock signal as a temporary time scale for control of the channels by a processor for determining digital signal phase differences between the channels; and outputting coordinates based on the digital quadrature signal components.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings:

FIG. 10 illustrates a signal from an input switch.

FIG. 12 illustrates a frequency division.

FIG. 11 illustrates a diagram of a Clock Gate cell/element.

DETAILED DESCRIPTION OF EMBODIMENTS OF THE INVENTION

Reference will now be made in detail to the embodiments of the present invention, examples of which are illustrated in the accompanying drawings.

Figure 5:
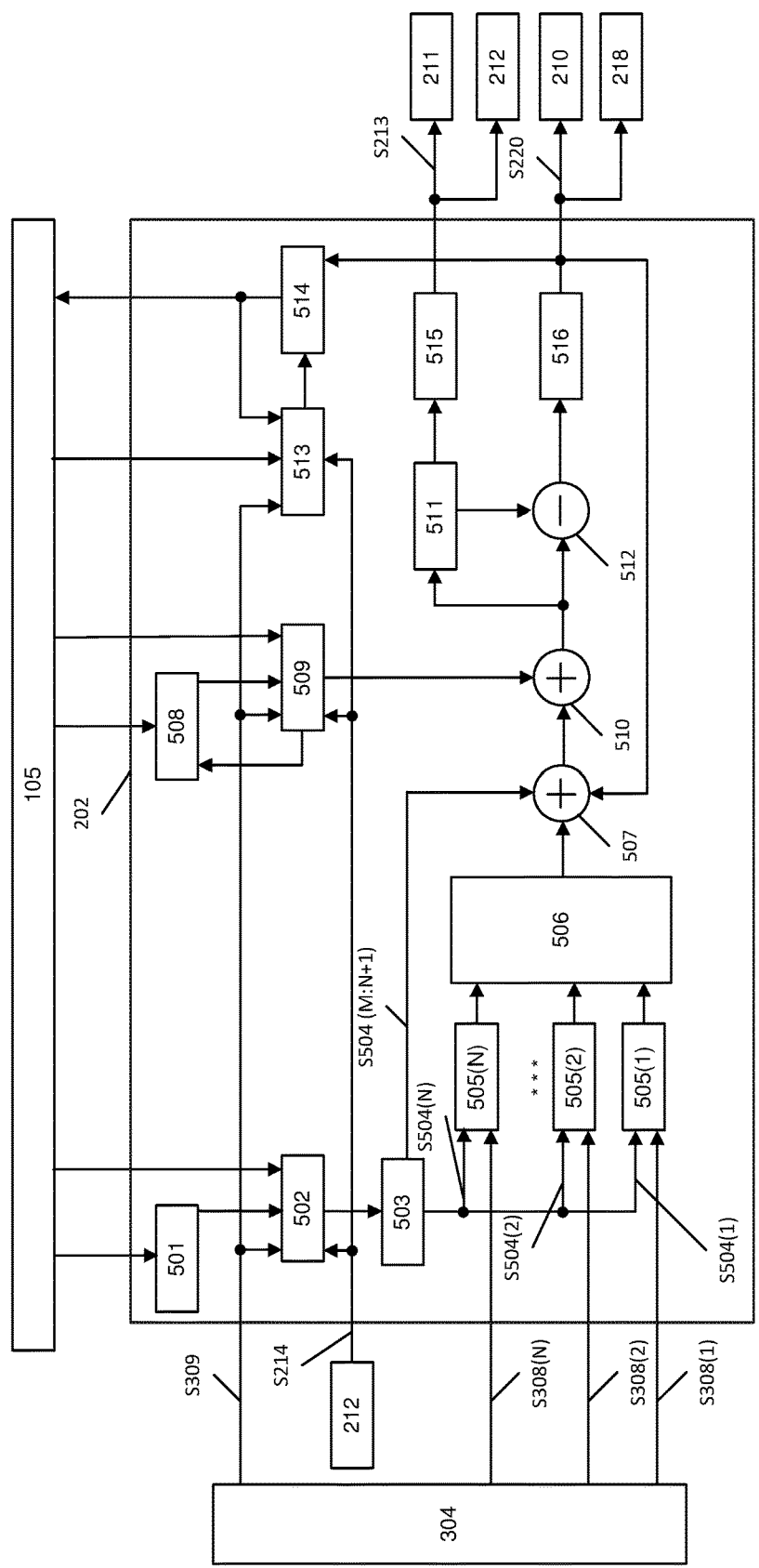
FIG. 5 illustrates a conventional code frequency generator.

The code sequence generator 202, shown in FIG. 5 includes:

501—an interface register of code rate;

502, 509, 513—a control mode module;

503—a buffer register of code rate;
S504—a code rate signal;
505—"AND" addition operation;
506—"OR" addition operation;
507, 510—accumulators;
508—a phase shift register;
511—a threshold unit;
512—a subtractor;
514—a buffer register of phase code;
515—a code chip register;
516—a code phase register.

The code sequence generator 202 is used as follows: after the processor 105 starts up the time scale generator 108, the net accumulator signal S308 and the tick signal S309 are fed to the code rate generator 202.

The actuating control mode module 502 writes data from the code rate interface register 501 into the code rate buffer register 503. The actuating control mode module 502 comes into action when one of the three events occurs:
 there is a write to the code rate interface register 501;
 there is an accumulation period signal S214;
 there is a tick signal S309.

The actuating control mode module 509 sends data from the phase shift interface register 508 to the accumulator 510 for one channel clock, after that, the phase shift interface register 508 is reset. The module 509 comes into operation when one of the three events occurs:
 there is a writing in the phase shift interface register 508;
 there is accumulation period signal S214;
 there is tick signal S309.

The actuating control mode module 513 fixes a current value of the code phase register 516 in the buffer register of phase code 514. The module 513 comes into operation if one of the three events occurs:
 there is a write to the code phase buffer register 514;
 there is an accumulation period signal S214;
 there is a tick signal S309.

Before operation of the channel 104, the processor 105 adjusts the control mode modules 502, 509, 513 to come into operation according to the tick signal S309.

A rate code is written in the code rate interface register 501 to generate a desirable code rate S213. The rate code has two parts:
 the highest part from M to N+1 arriving at the accumulator 507;
 the lowest part from N to 0 which is mixed with net accumulator signal S308.

The actuating control mode module 502 writes code rate from the code rate interface register 501 into the code rate buffer register 503.

Then, a bit of code rate signal S504(N) is fed to the "AND" addition 505(N), where it is mixed with net accumulator signal S308(N).

After that, a bit of code rate signal S504(*) is fed to the "AND" addition 505(*), where it is mixed with net accumulator signal S308(*).

And, again, a bit of code rate signal S504(2) is fed to the "AND" addition 505(2), where it is mixed with net accumulator signal S308(2).

And, finally, a bit of code rate signal S504(1) is fed to the "AND" addition 505(1), where it is mixed with net accumulator signal S308(1).

The outputs of all "AND" addition modules 505 are fed to "OR" addition module 506. A one-bit number from module "OR" is then fed to accumulator 507.

Bits of the code rate signal S504 from M up to N+1 are also fed to accumulator 507.

The number from the accumulator 507 is fed to accumulator 510.

If necessary, the processor 105 can write a phase shift code into register 508. The phase shift code includes:
 an integer part from K up to M+1, which can be positive and negative;
 a fractional part from M up to N+1.

Actuating control mode module 509 sends data from the phase shift interface register 508 to the accumulator 510 for one channel clock, after that the phase shift interface register 508 is reset.

The value from the accumulator 510 is further fed to the threshold unit 511 and the subtractor 512. The threshold unit estimates the number from the accumulator, which is from K up to M+1 bits, and makes a decision:
 if this number is equal to "zero", zero is fed to the subtractor 512 and the code chip register 515;
 if this number is smaller than zero, zero is fed to the subtractor 512 and the code chip register 515;
 if this number is larger than zero, unit is fed to the subtractor 512 at bit M+1 (at all the rest bits—zero) and the code chip register 515.

The contents of the subtractor 512 is fed to the code phase register 516 and further it is fed to the strobe generators 210, 218 and to the accumulator 507.

If necessary, the processor uses the control mode module 513 and the buffer register of phase code 514.

In operation of the channel 104, the processor 105 can control:
 the code rate interface register 501;
 the control mode module 502, 509, 513;
 the phase shift register 508;
 the buffer register of the phase code 514.

Figure 6:
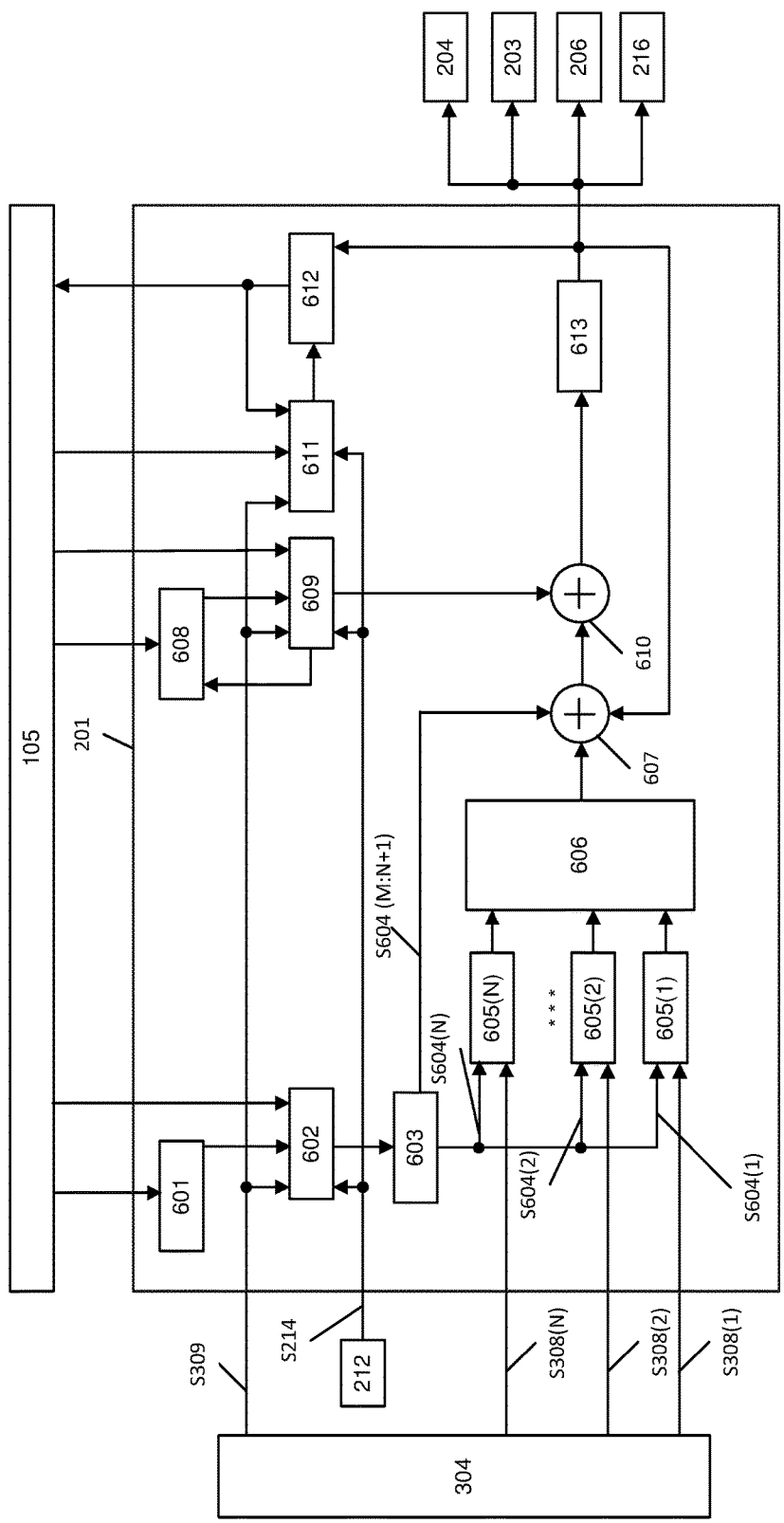
FIG. 6 illustrates a conventional carrier generator.

The carrier generator, shown in FIG. 6, includes:
 601—a carrier interface register;
 602, 609, 611—control mode modules;
 603—a carrier buffer register;
 S604—a carrier signal;
 605—"AND" addition operation;
 606—"OR" addition operation;
 607, 610—accumulator;
 608—a carrier phase shift register;
 612—a buffer register of carrier phase;
 613—a carrier phase register.

The carrier generator is used as follows: after the processor 105 starts up the time scale generator 108, the net accumulator signal S308 and the tick signal S309 are fed to the carrier generator 201 from the net accumulator generator 304. Actuating the control mode module 602 writes data from the carrier interface register 601 into the carrier buffer register 603. The module 602 comes into action when one of the three events occurs:
 there is a write to the carrier interface register 601;
 there is an accumulation period signal S214;
 there is a tick signal S309.

The actuating control mode module 609 sends data from the phase shift interface register 608 to the accumulator 610 for one channel clock, after that the phase shift interface register 608 is reset. The module 609 comes into operation when one of the three events occurs:
 there is a write to the carrier phase shift register 608;
 there is an accumulation period signal S214;
 there is a tick signal S309.

The actuating control mode module 611 fixes a current value of the code phase register 613 in the buffer register of the carrier phase 612. The module 611 comes into operation if one of the three events occurs:

there is a write to the buffer register of the carrier phase 612;

there is an accumulation period signal S214;

there is a tick signal S309.

Before operation of the channel 104, the processor 105 adjusts the control mode modules 602, 609, 611 to come into operation according to the tick signal S309.

A carrier frequency is written into the carrier interface register 601 to generate a desirable carrier phase. The carrier frequency consists of two parts:

the highest part from M to N+1, arriving at the accumulator 607;

the lowest part from N to 0, which is mixed with the net accumulator signal S308.

The actuating control mode module 602 writes a carrier frequency from the carrier interface register 601 into the carrier buffer register 603.

Then, a bit of carrier signal S604(N) is fed to the "AND" addition 605(N), where it is mixed with net accumulator signal S308(N).

After that, a bit of carrier signal S604(*) is fed to the "AND" addition 605(*), where it is mixed with net accumulator signal S308(*).

And, again, a bit of carrier signal S604(2) is fed to the "AND" addition 605(2), where it is mixed with net accumulator signal S308(2).

And, finally, a bit of carrier signal S604(1) is fed to the "AND" addition 605(2), where it is mixed with net accumulator signal S308(1).

The outputs of all "AND" addition modules 605 are fed to "OR" addition module 606. And one-bit number from module "OR" is fed to accumulator 607.

Bits of the carrier signal S604 from M up to N+1 are also fed to the accumulator 607.

The number from the accumulator 607 is fed to the accumulator 610.

If necessary, the processor 105 can write a phase shift carrier into the register 608. The carrier phase shift code has length from M up to N+1.

The actuating control mode module 609 sends data from the phase shift interface register 608 to the accumulator 610 for one channel clock, after that the phase shift interface register 608 is reset.

The value from the accumulator 610 is further fed to the carrier phase register 613. And then, phase from block 613 is fed to blocks 204, 203, 206, 216 and to the accumulator 607.

If necessary, the processor 105 applies the control mode module 611 and the fixed carrier phase buffer register 612.

In operation of the channel 104, the processor 105 can control:

the code rate interface register 601;

the control mode module 602, 609, 611;

the phase shift register 608;

the buffer register of carrier phase 612.

Figure 7A:
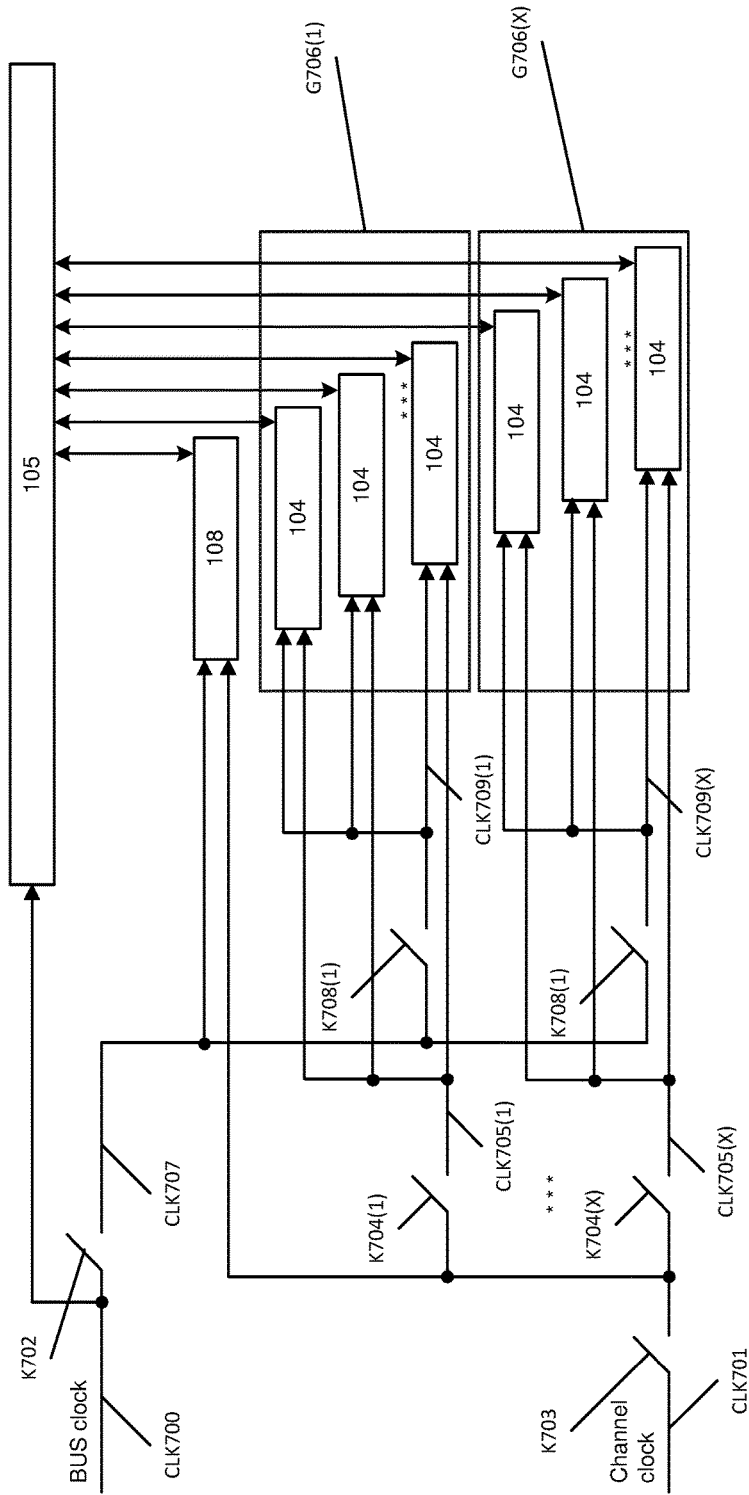
FIG. 7A illustrates conventional control of inputting clocks by a processor.

Controlling clocks in conventional receivers is shown in FIG. 7A, where:

CLK700—a bus clock;

CLK701—a channel clock;

K702—a key disabling the bus clock;

K703—a key disabling the channel clock;

K704—a key disabling the channel clock of a group of channels;

CLK705—a channel clock of a group of channels;

G706—a group of channels;

CLK707—a bus clock;

CLK708—a key disabling the channel clock of a group of bus clock;

CLK709—a group of bus clock;

In the conventional device, a bus clock CLK700 and channel clock CLK701 are fed to it.

The bus clock CLK700 is fed to the processor 105 and to the key K702 which is under control of the processor 105. The clock 707 from K702 is fed to the key K708 and the time scale generator 108. After the key K708, the group bus clock CLK709 is fed to:

104—standard channels.

Channel clock CLK701 is fed to the key K703 disabling channel clocks to the standard channels 104 and the time scale generator 108. Then the channel clock is fed from the key K703 to the time scale generator 108 and to keys of a group of channels K704. As a result, a channel clock of a group of channels CLK705 is outputted from the keys of a group of channels K704 and fed to its group of channels G706.

Figure 8A:
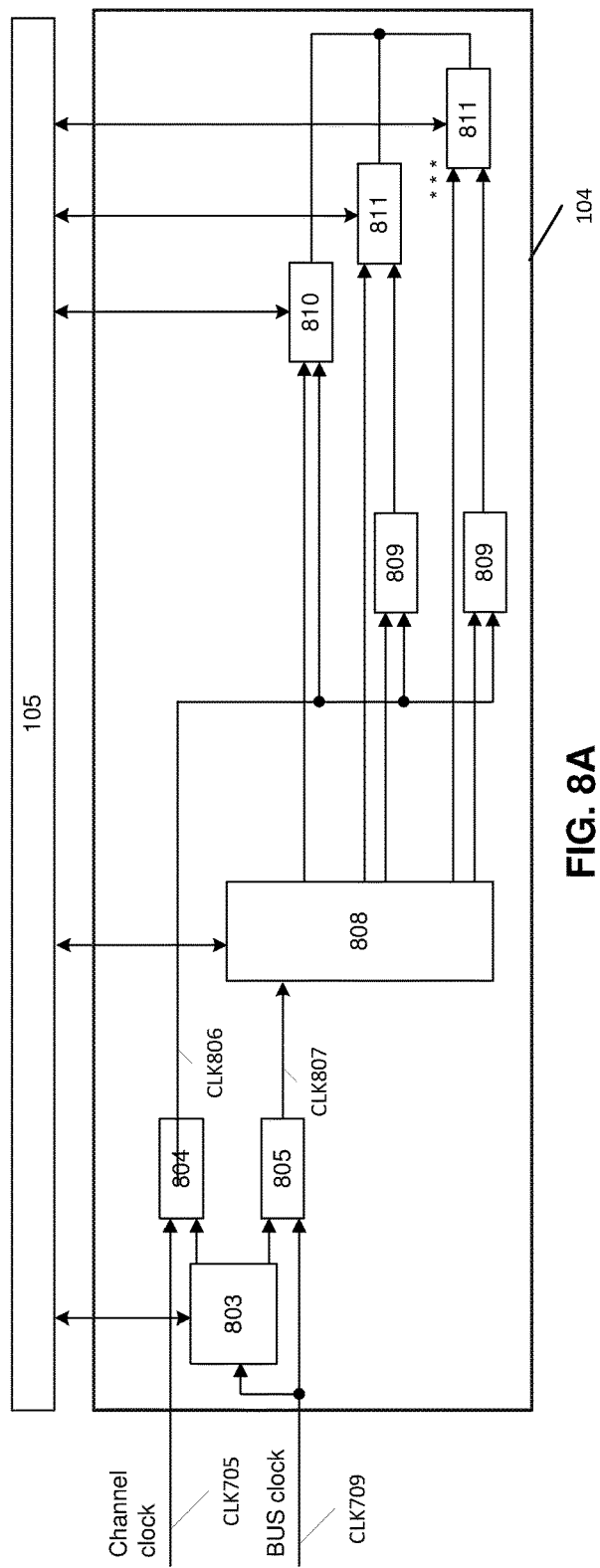
FIG. 8A illustrates control of inputting clocks by the processor in a channel.

Clock control in the conventional channel 104 is shown in FIG. 8A, where:

803—a control register to feed clocks in channel 104;

804—CLK Gate (interlocking device) for group channel clock CLK705;

805—CLK Gate (interlocking device) for bus clock CLK709;

CLK806—an internal channel clock;

CLK807—an internal bus clock;

808—interface registers;

809—CLK Gate (interlocking device) for internal channel clock CLK806;

810—a channel part always operating when internal clock CLK807 is on;

811—a channel part operating when CLK Gate 809 is off.

The group channel clock CLK705 and the group bus clock CLK709 are fed to channel 104. The group channel clock CLK705 is fed to the CLK Gate 804 of the group channel clock. The group bus clock CLK709 is fed to its CLK Gate 805.

The group bus clock CLK709 is permanently fed to the control register 803.

The processor 105, with the help of the control register 803, turns on/off CLK Gates 804 and 805. If the channel 104 is out of use, CLK Gates 804 and 805 do not allow clocks to pass into the channel.

The processor 105, with the help of the control register 803, turns on/off CLK Gates 804 and 805:

at "0" in the control register 803, CLK Gates 804 and 805 do not allow clocks CLK705 and CLK709 to pass into the channel 104;

at "1" in the control register 803, CLK Gates 804 and 805 allow clocks CLK705 and CLK709 to pass into the channel 104.

Internal bus clock CLK807 is outputted from CLK Gates 805. Clock CLK807 is further fed to interface registers 808.

Internal channel clock CLK806 is outputted from block 804. Clock CLK806 is fed to:

the constantly-operating channel part 810 (when clock CLK806 is available);

the block 809, which lets clock CLK806 go to channel part 811 when control signal "1" is provided from interface registers 808.

Signals from interface registers are fed to channels parts 810 and 811. These channel parts 810 and 811 are connected to each other.

The processor 105 can:
read and write data from/to the interface registers 808 and the clock control register 803;
read data from the channel parts 810 and 811.

All channels 104 in the conventional device operate on the same channel frequency CLK701. Channel frequency CLK701 needs to be twice as high as the width of the processed signal spectrum.

A plurality of RF-paths 102 can be connected to this device and can have different bandwidths. The bandwidths can differ by several times.

Different bandwidths can be processed with different channel frequencies.

For example:
If the width of the RF-path is 40 MHz, then the channel 104 should have channel frequency CLK701 minimum 80 MHz.

If the width of the RF-path is 25 MHz, then the channel 104 should have channel frequency CLK701 of minimum 50 MHz.

If the width of the RF-path is 20 MHz, then the channel 104 should have channel frequency CLK701 of minimum 40 MHz.

If the width of the RF-path is 10 MHz, then the channel 104 should have channel frequency CLK701 of minimum 20 MHz.

Note that all these bandwidths can be processed at the highest channel frequency −80 MHz.

From the above, one can conclude that operation of the channels 104 on different channel frequencies can save power consumption.

A standard solution is to divide the clock by $2^N$ and connecting of this divided clock to a determined channel group. Such a solution makes channel groups operating on the determined divided clock (clock tree), and does not allow operation of any channel with any RF-path.

Figure 1A:
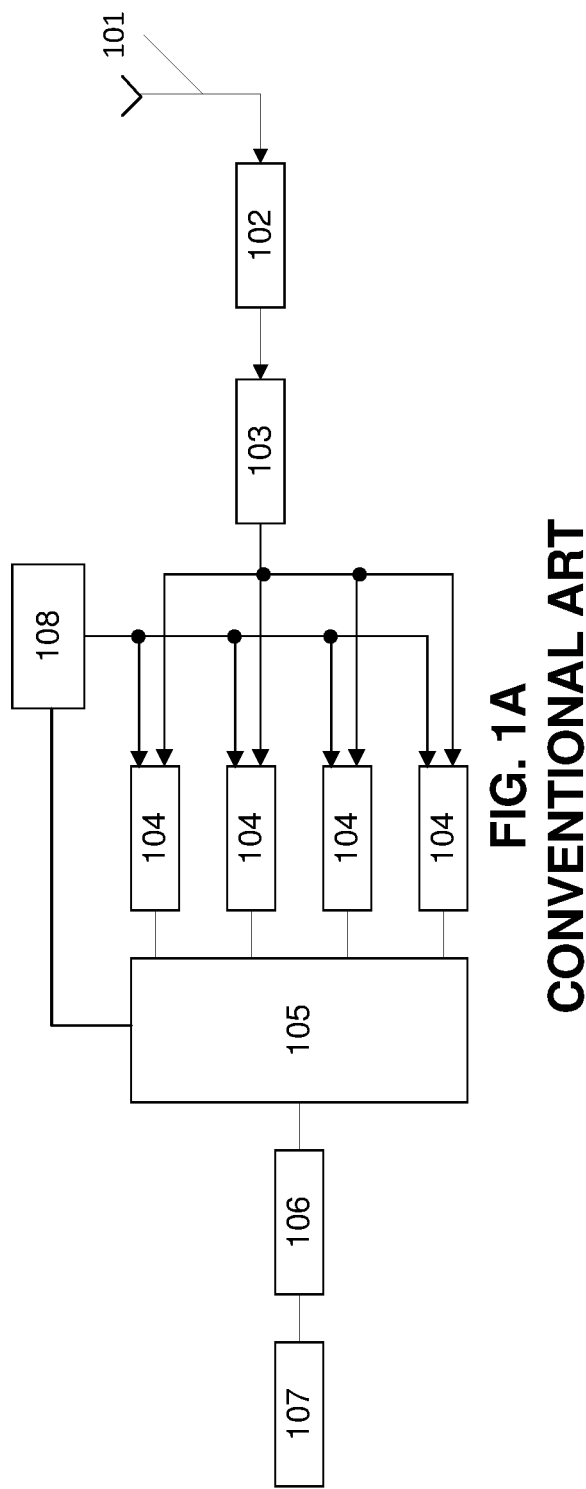
FIG. 1A illustrates a block-diagram of a minimal/basic unit (4 Channels) for a conventional receiver.
Figure 1B:
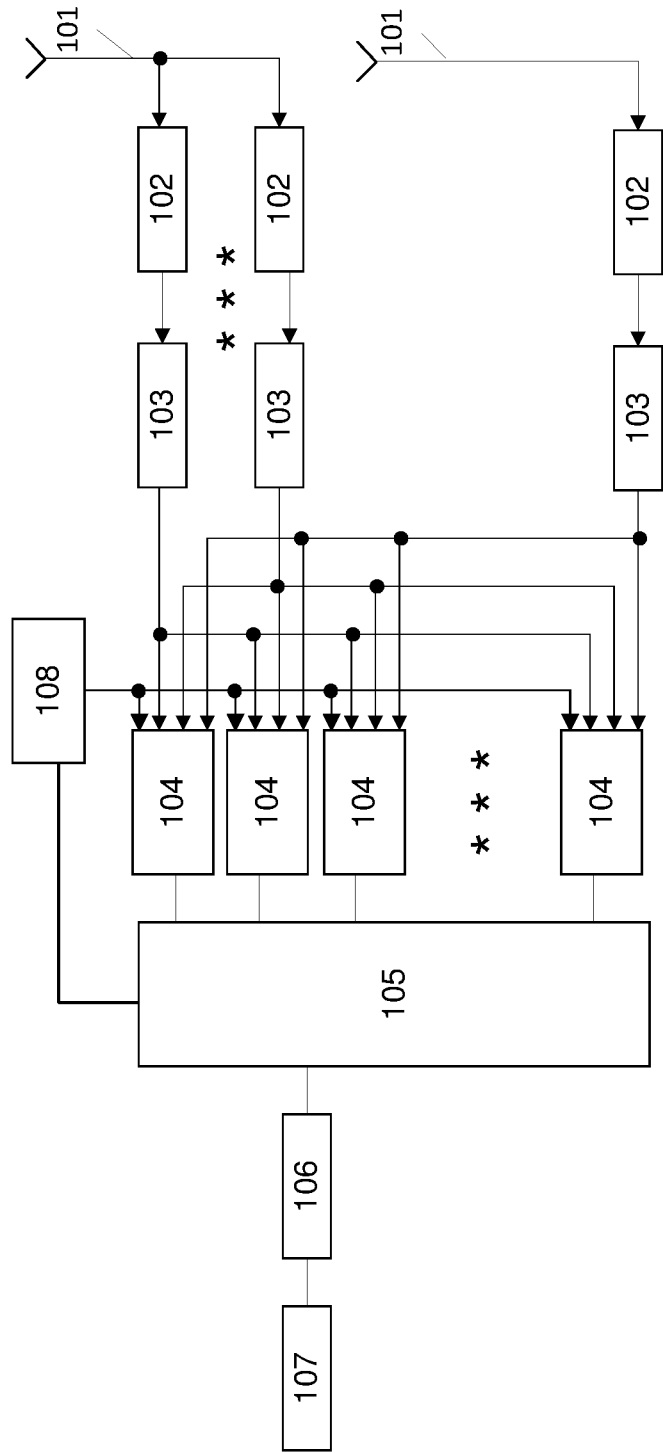
FIG. 1B illustrates a block-diagram of an extended unit (P channels) for a conventional receiver.
Figure 1C:
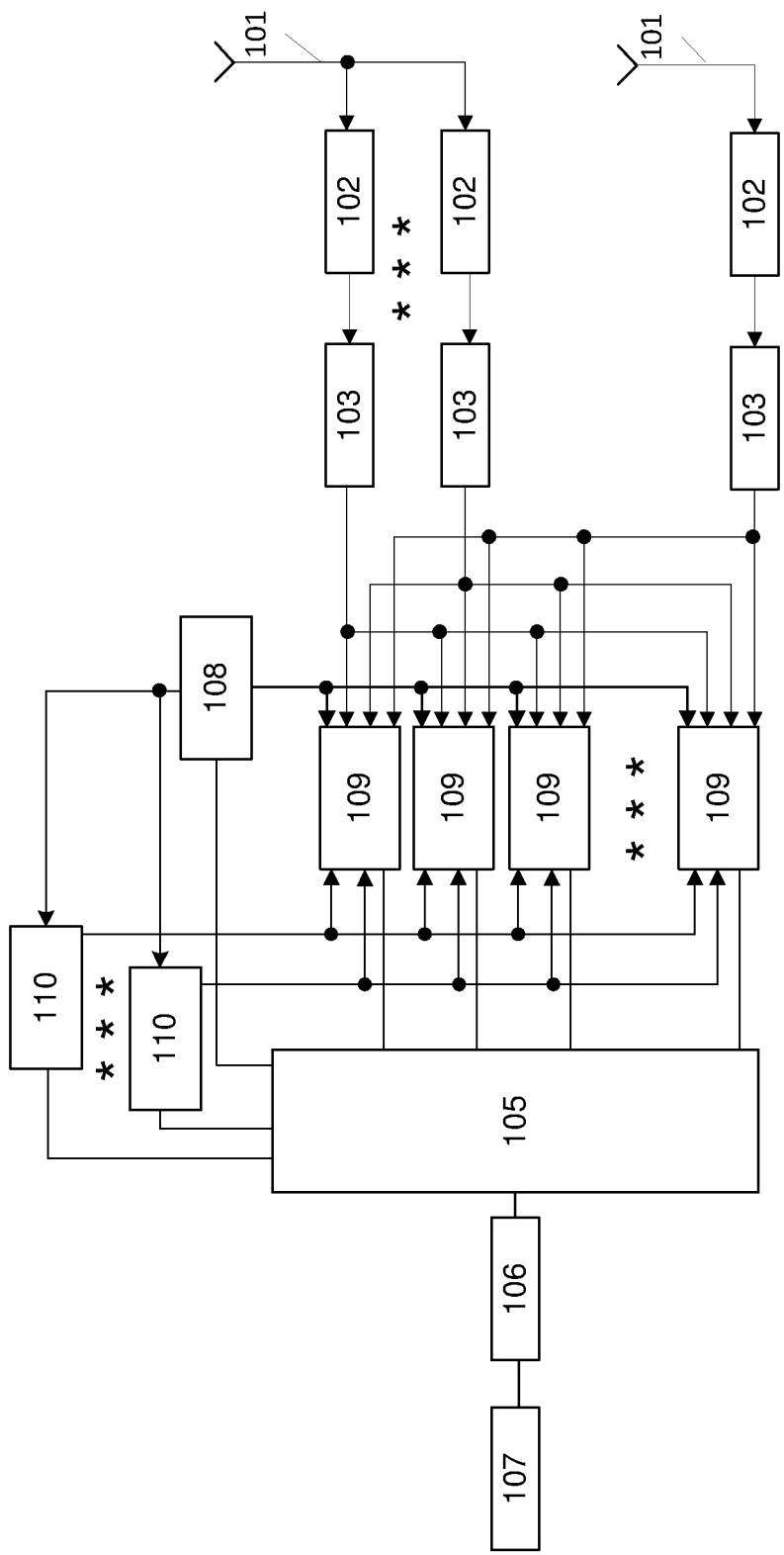
FIG. 1C illustrates a block-diagram of an extended unit (P channels) for the proposed receiver with a clock divider.
Figure 2:
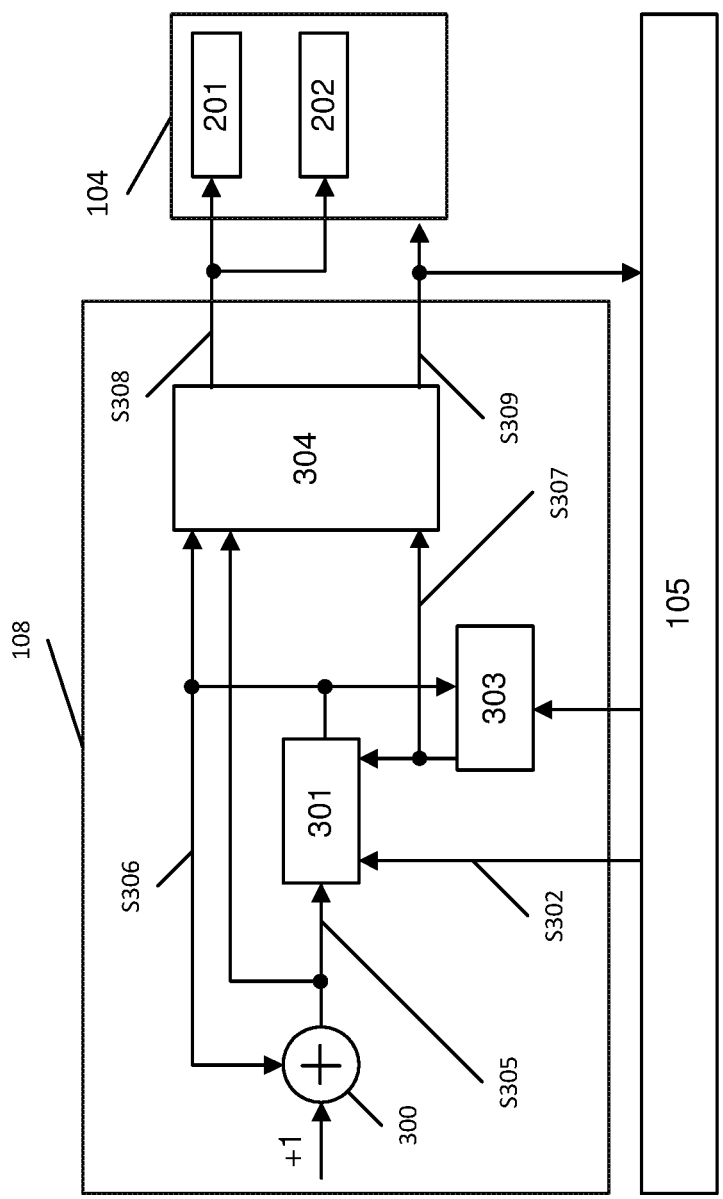
FIG. 2 illustrates a conventional time generator.

In the proposed system, shown in FIG. 1C, all the channels 104 and the time scale generator 108 use the same channel clock CLK701.

All the channels 104 use the following signals:
S309—a tick signal is assigned equal to $2^N$ and is the time scale for all the channels 104 and the processor 105;
S308—a net accumulator signal for generating code rate S213 and the carrier phase 201 in all the channels 104;
S221—a signal from the input switch 200, using this input switch, the processor 105 selects to which ADC 103 and respectively RF-path 103 the channel 104 should be connected.

Figure 3A:
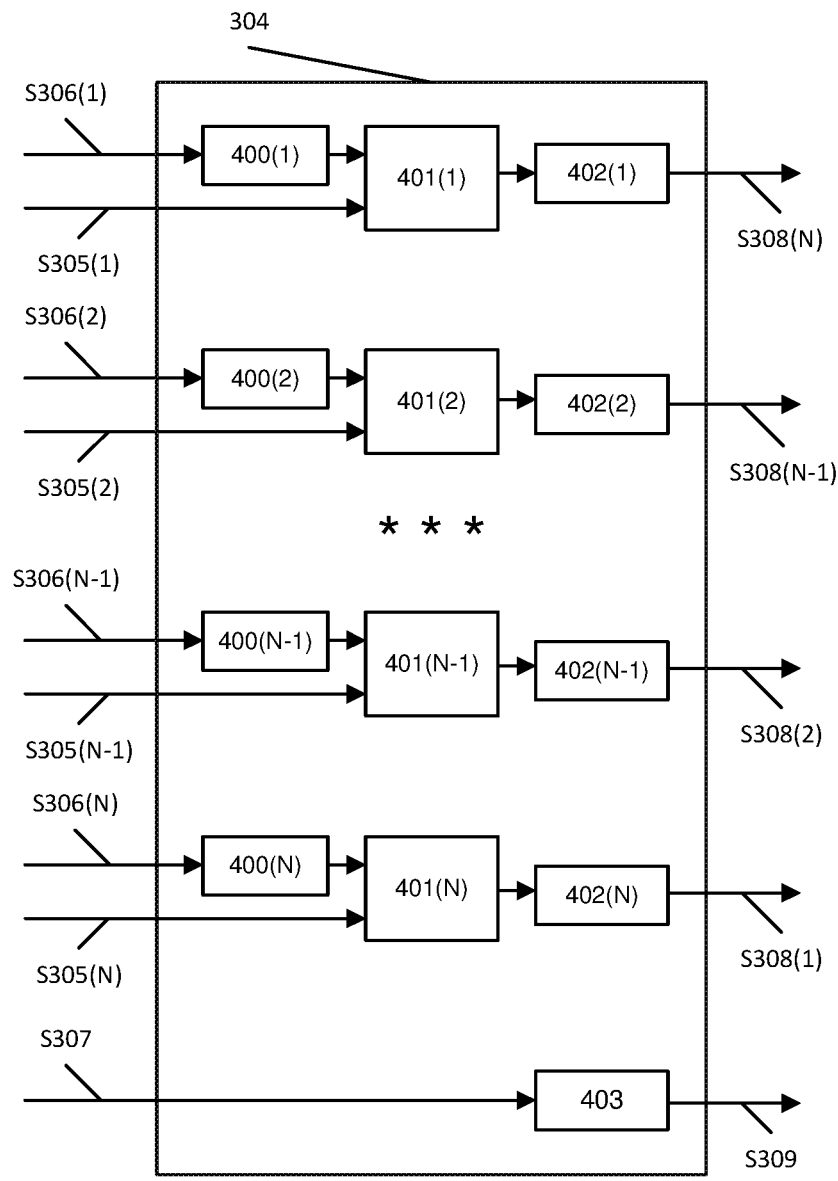
FIG. 3A illustrates a conventional generator of net accumulator.
Figure 3B:
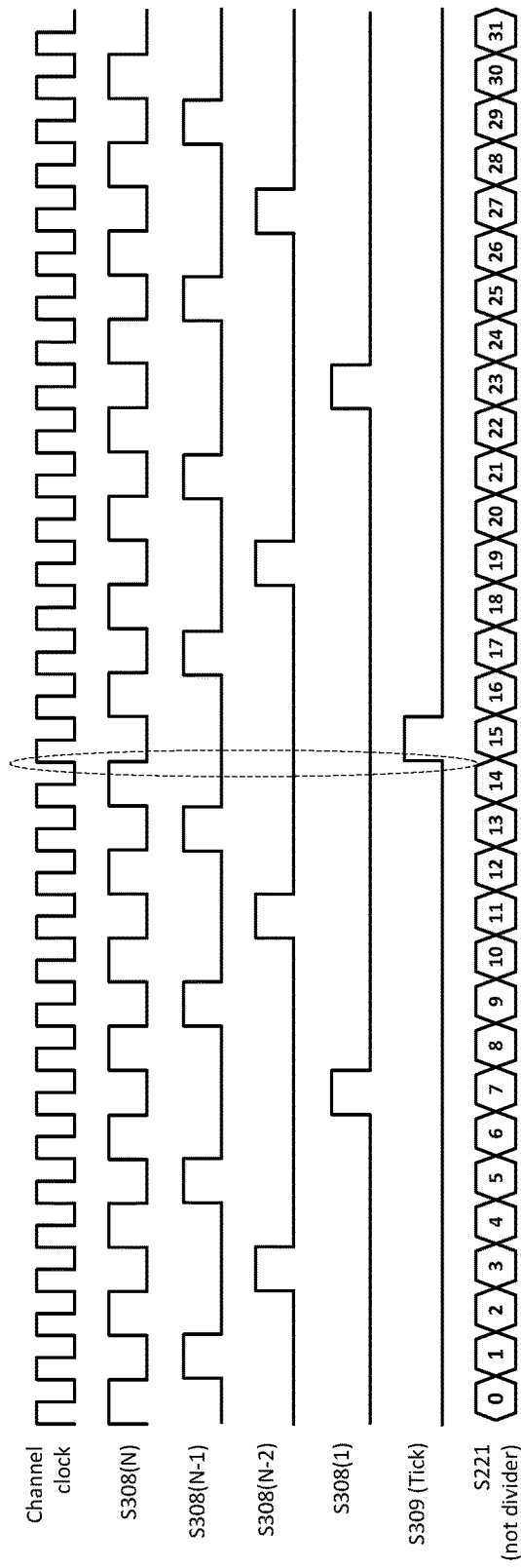
FIG. 3B illustrates signals of net accumulator.
Figure 4:
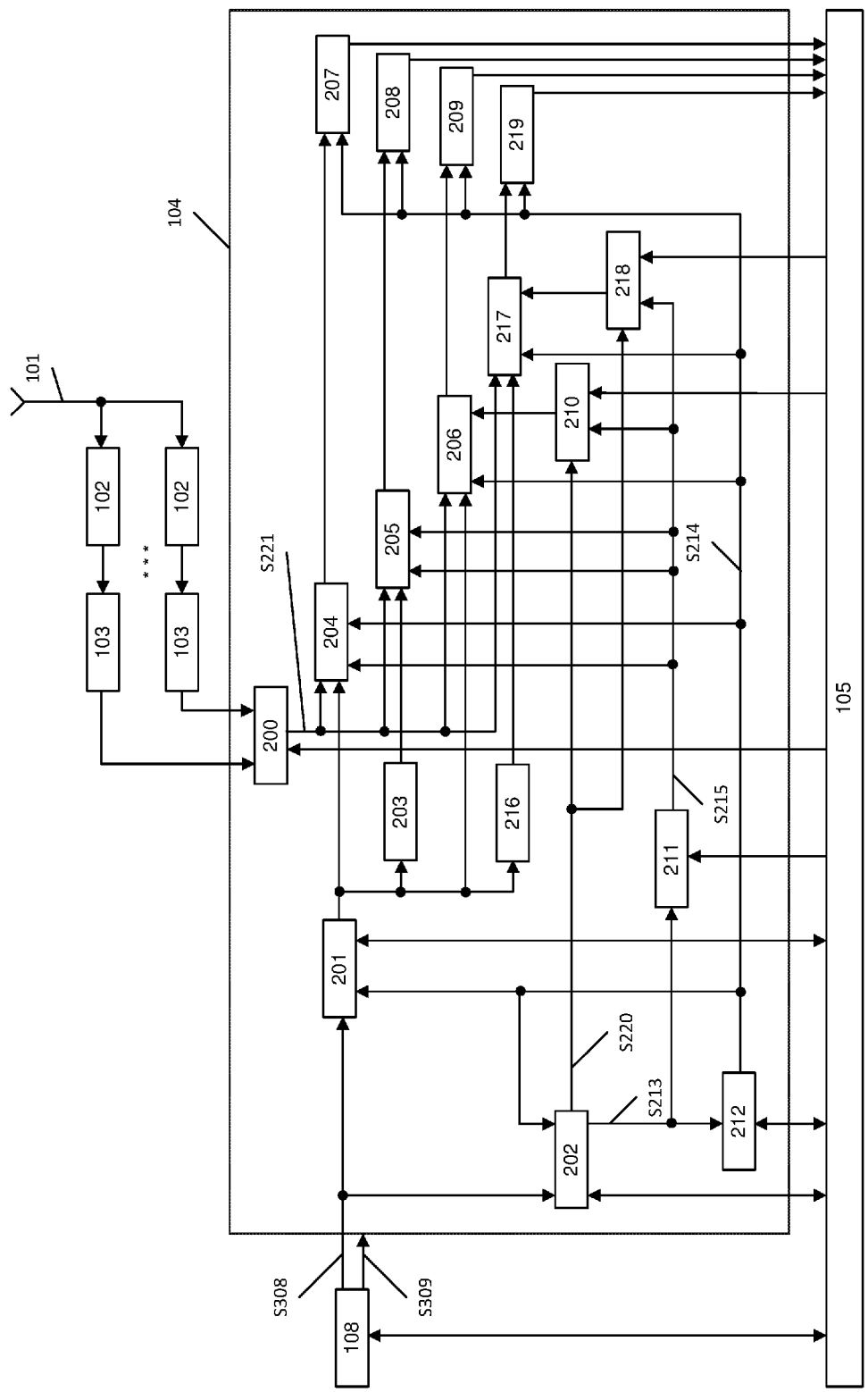
FIG. 4 illustrates a conventional channel block-diagram.

Signals S308, S309, S221 are generated with channel clock rate CLK701 (see FIG. 3B).

Using the RF-path 102 that varies in the spectrum width by factor of several x. For example:

TABLE 1

| Spectrum width MHz | Used clock | Description |
|---|---|---|
| 100 | CLK701 | Channel clock CLK701 |
| 75 | CLK701 | Since number 75 cannot be contained in 100 twice, use CLK701 |
| 50 | CLK701/2 | 100 is divisible by 50 (100 is 50 × 2), use CLK701/2 |
| 40 | CLK701/2 | Number 40 is contained twice in 100, use CLK701/2 |
| 25 | CLK701/4 | 25 multiplied by 4 is 100, then use CLK701/4 |
| 10 | CLK701/8 | 10 multiplied by 10 is 100, then use CLK701/8 |

In the proposed device, the clock rate is reduced in $2^N$, depending on the widest bandwidth (see Table 1).

Frequency division by 2:
S309—a tick signal will come at the moment of clock arrival, which allows it to synchronize in time of processing navigation signals;
S308—a net accumulator signal. S308(N) will not be considered in generating code rate and carrier rate, but it will be considered in calculating frequencies and writing into the interface registers 501 and 601;
S221—a signal from input switch 200 will be taken every second clock which corresponds to 2 times reduction in data rate.

Frequency division by 4, to result in:
S309—a tick signal will come at the moment of clock arrival, which allows it to synchronize in time of processing navigation signals;
S308—a net accumulator signal. S308(N) and S308(N−1) will not be considered in generating code rate and carrier rate, but it will be considered in calculating frequencies and writing into the interface registers 501 and 601;
S221—a signal from the input switch 200 will be taken every fourth clock which corresponds to 4 times reduction in data rate.

Frequency division by 8, to result in:
S309—a tick signal will come at the moment of clock arrival, which allows it to synchronize in time of processing navigation signals;
S308—net summing signal. S308(N), S308(N−1) H S308(N−2) will not be considered in generating code rate and carrier rate, but it will be considered in calculating frequencies and writing into the interface registers 501 and 601;
S221—a signal from input switch 200 will be taken every eighth clock which corresponds to 8 times reduction in data rate.

Frequency division by A times, then we get:
S309—a tick signal will come at the moment of clock arrival, which allows it to synchronize in time of processing navigation signals;
S308—of the net accumulator. S308(N), S308(N−1) . . . S308(N−log 2(A)−1) will not be considered in generating code rate and carrier rate, but it will be considered in calculating frequencies and writing into the interface registers 501 and 601;
S221—a signal from input switch 200 will be taken every A clock which corresponds to A times reduction in data rate.

Let us numerate each sample of the signal S221. FIG. 10 shows the process of taking the input signal depending on frequency division. From the description, the input data S221 are synchronous by the sample number at different division of the channel clock CLK701.

At the moment of arriving A-clock, the clock CLK701 and clocks divided by 2, 4, 8, etc. will also be available.

At the moment of arriving the $8^{th}$ clock, the clock CLK701 and clocks divided by 2, 4 will be also available.

And at the moment of arriving the $4^{th}$ clock, the clock CLK701 and clocks divided by 2 will be also available.

To divide frequency, a cell/unit Gate (FIG. 11) is used, at the input, an Enable frequency division signal Div800 is generated. The signal Div800 arrives one channel clock earlier than the channel clock CLK806, before generating divided the channel clock CLK818 (FIG. 12). At the moment of arriving the signal Div800 with A-divided clock, 2-, 4-, 8- etc. divided clocks will also arrive. Similarly, when the signal Div800 with 8 division comes, signals with division by 2 and 4 will also come. And the signal Div800 with division 4 will arrive with the signal Div800 with division by 2.

A proposed receiver with clock dividers is shown in FIG. 1C. A four-channel receiver can process signals from four satellites, and P-channel receiver can process signals from P satellites.

As a rule, receivers include:
- 101—an antenna;
- 102—an RF-path;
- 103—an analog-digital converter (hereafter ADC);
- 105—a processor;
- 106—a communications module;
- 107—a user;
- 108—a time scale generator;
- 109—a new channel;
- 110—a clock divider.

The new receiver is used as follows: before operation, the processor 105 adjusts the clock dividers 110, depending on the spectrum width of the RF-paths 102. The processor 105 also adjusts the time scale generator 108. The time scale generator 108 operates in-phase/synchronously of the clock dividers 110. The time scale generator 108 generates signal the S309 (tick) with equal time instants divisible by $2^N$ to the power of the channel clocks CLK701.

A satellite signal arrives at the antenna 101, then the RF-path 102, the ADC 103 and is fed to the channel 109. Before the ADC 103 starts signal processing, the processor 105 outputs a command to use the clock divider 110 in the channel 109. The channel 109 processes the signal from the ADC 103. The time scale generator 108 generates a time mark (tick). The processor 105 controls the new channel 109. The processor 105 processes data from the new channels 109 when the tick signal S309 is available and transmits the data to the user 107 via the communications module 106.

Figure 7B:
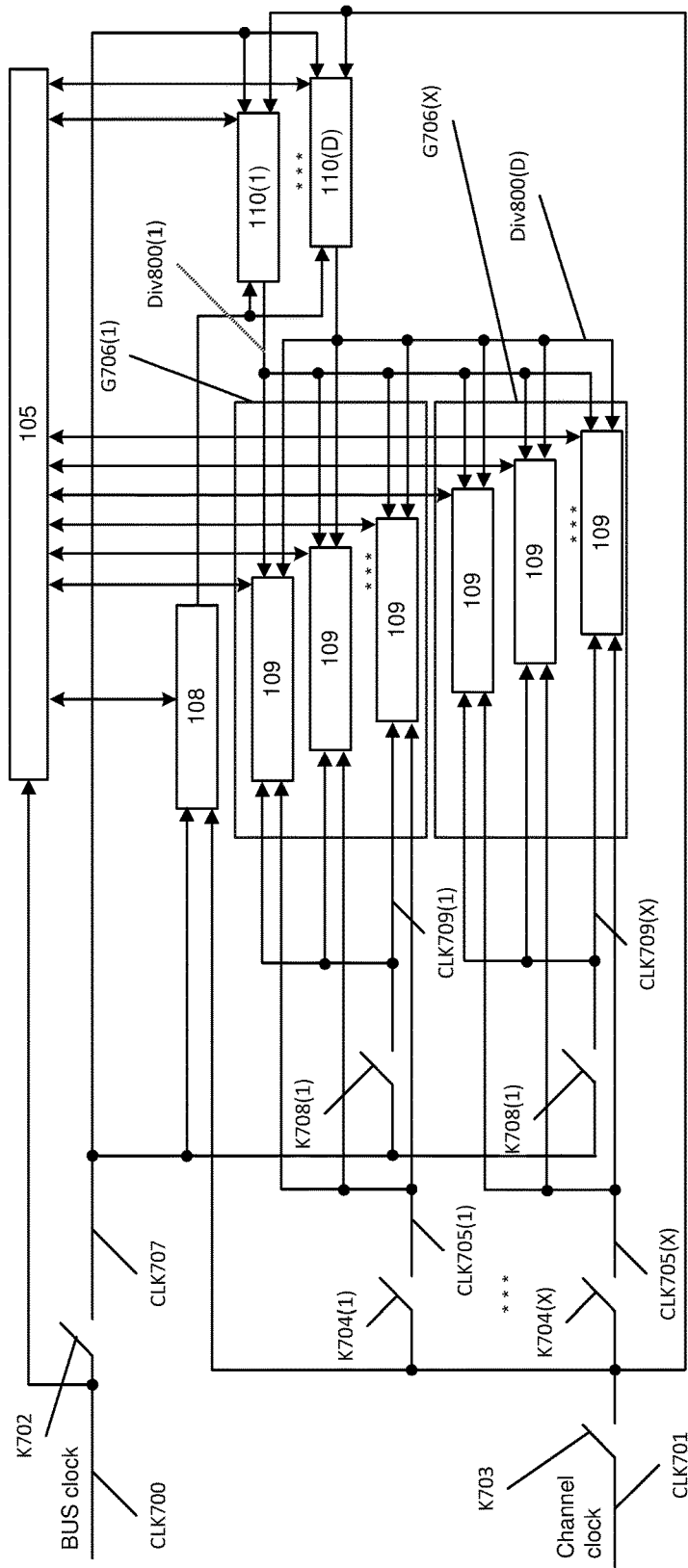
FIG. 7B illustrates control of inputting clocks by the processor and clock divider.

Clock control in the proposed device is shown in FIG. 7B, where:
- CLK700—a bus clock;
- CLK701—a channel clock;
- K702—a key disabling the bus clock;
- K703—a key disabling the channel clock;
- K704—a key disabling the channel clock of a group of channels;
- CLK705—a channel clock of a group of channels;
- G706—a group of channels;
- CLK707—a bus clock;
- CLK708—a key disabling the channel clock of a group of bus clocks;
- CLK709—a group of bus clocks;

In the conventional device, a bus clock CLK700 and a channel clock CLK701 are fed to it.

In the proposed device, the bus clock CLK700 is fed to the processor 105 and to the key K702 which is under control of the processor. The clock from K702 is fed to the key K708, a time scale generator 108 and clock dividers 110. After the key K708, the group bus clock CLK709 is fed to:
- 104—standard channels;

The channel clock CLK701 is fed to the key K703 disabling channel clocks to the new channels 109, the clock dividers 110 and the time scale generator 108. Then the channel clock is fed from the key K703 to the time scale generator 108, the clock dividers 110 and to the keys of a group of channels K704. As a result, a channel clock of a group of the channels CLK705 is outputted from the keys of a group of channels K704 and fed to its group of channels G706.

Division signals Div800 from clock dividers 110(1) . . . 111(D) are fed to all the new channels 109, which allows any random channel 109 to select a clock division coefficient CLK705 (CLK701), depending on the processed division signal.

Figure 8B:
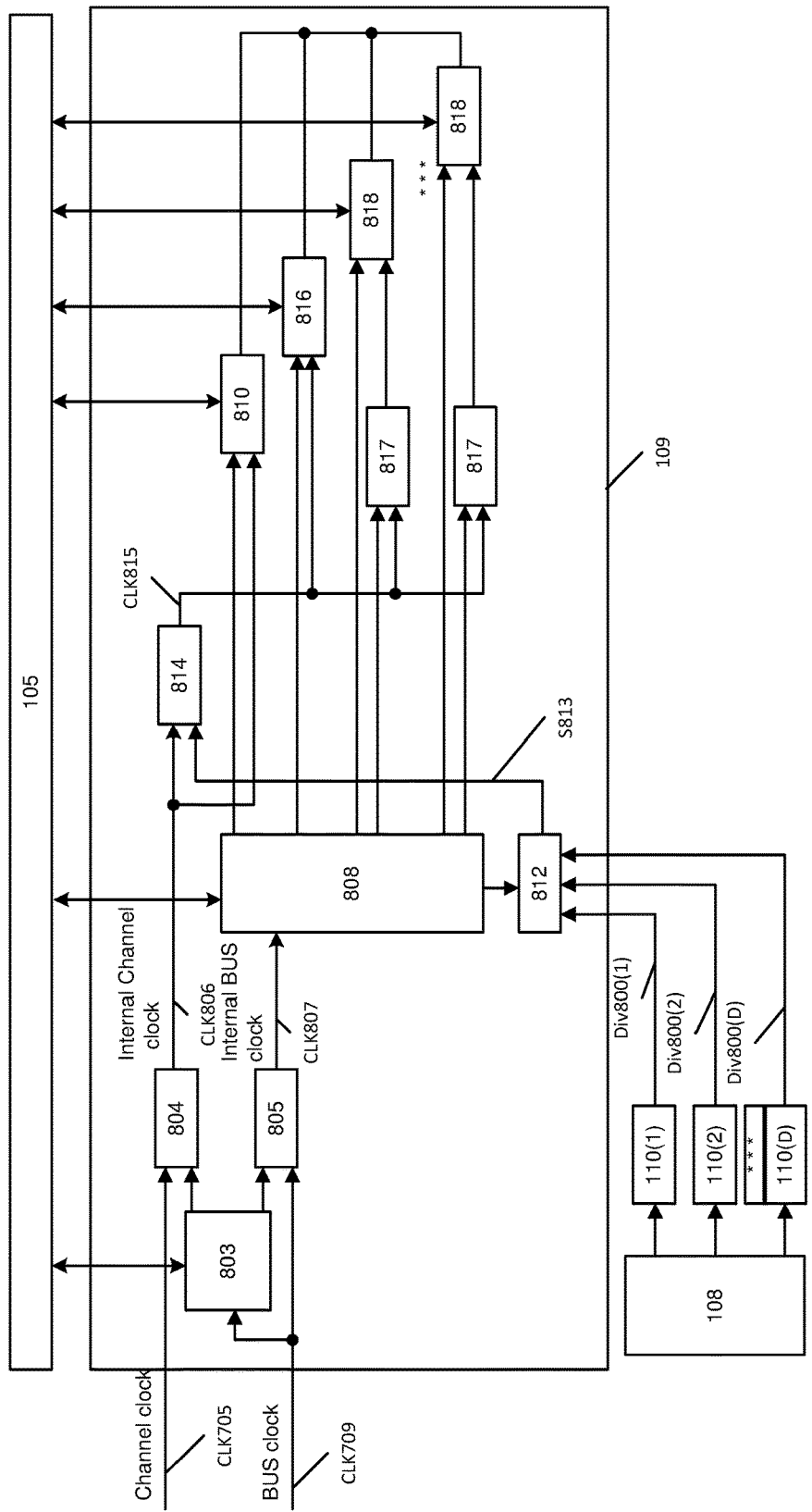
FIG. 8B illustrates control of inputting clocks by processor in a channel and clock divider.

Channel control in the new channel 109 is shown in FIG. 8B, where:
- 803—a control register to feed clocks in channel 109;
- 804—CLK Gate (interlocking device) for group channel clock CLK705;
- 805—CLK Gate (interlocking device) for bus clock CLK709;
- CLK806—an internal channel clock;
- CLK809—an internal bus clock;
- 808—interface registers;
- 810—a channel part always operating when internal channel clock CLK806 is on;
- 812—a division switch signal DIV800(*);
- S813—a division coefficient signal;
- 814—CLK Gate (interlocking device) for internal channel clock CLK806; CLK815—a divided channel clock;
- 816—a channel part always operating when internal divided clock CLK815 is on;
- 817—CLK Gate (interlocking device) for internal divided channel clock CLK815;
- 818—a channel part always operating when block 817 is off.

The group channel clock CLK705 and the group bus clock CLK709 are fed to new channel 109. The group channel clock CLK705 is fed to the CLK Gate 804 of the group channel clock. The group bus clock CLK709 is fed to its CLK Gate 805.

The group bus clock CLK709 is always fed to control register 803.

The processor 105, with the help of control register 803, turns on/off CLK Gates 804 and 805. If the channel 109 is out of use, CLK Gates 804 and 805 do not allow clocks to pass into the channel.

The processor 105 with the help of the control register 803 turns on/off CLK Gates 804 and 805:
at "0" in the control register 803, CLK Gates 804 and 805 do not allow the clocks CLK705 and CLK709 to pass into the channel 109;
at "1" in the control register 803, CLK Gates 804 and 805 allow clocks CLK705 and CLK709 to pass into the channel 109.

Internal bus clock CLK807 is outputted from CLK Gates 805. Clock CLK807 is further fed to the interface registers 808.

The internal channel clock CLK806 is outputted from block 804. The clock CLK806 is fed to:
the always-operating channel part 810 (when the clock CLK806 is available); block 814.

The division switch signal 812 selects the needed signal Div800 based on a signal from the interface registers 808 (set by the processor 105). The division coefficient signal S813 is fed to block 814. Divided channel clock CLK815 from the block 814 is fed to the channel part 816, always operating when the internal divided clock CLK815 is on block 817 lets the divided channel clock CLK815 pass in a part of channel 818, if control signal "1" is obtained from the interface register 808.

Signals from the interface registers are fed to channels parts 810, 816, 818 and 817. These channel parts 810, 816, 818 and 817 are connected to each other.

The processor 105 can:
read and write data from/to the interface registers 808 and clock control register 803; and
read data from the channel parts 810, 816.

The proposed receiver is capable of saving power consumption because the processor 105 switches off the bus clock CLK707 with the key K702 when there is no calls to the channels 109 and the time scale generator 108. In this case, clock delivery/sending to all registers that use the bus clock CLK707 stops. Therefore, during operation of the new receiver, the processor 105 very seldom refers to the channels 109 and the time scale generator. The processor 105 disables K708, and then does not use the group channel G706.

Channels in the receiver are separated into groups G706. If none of channels 109 is used, group channel clock CLK705 is off by disabling key 704.

Clock divider 110 is on by processor 105 and starts generating division signal Div800.

In the channel 109 the channel parts 816 and 818 are the main part of the channel being clocked by the channel clock CLK701. Frequency division enables to considerably reduce consumption by the channels 109.

An example of using the channel division mechanism has the bus frequency is 100 MHz. Channel rate is 100 MHz.

40% of total channel area operates in accordance with the group bus clock CLK709.

1% of total channel area operates in accordance with the bus clock CLK806.

59% of total channel area operates in accordance with the divided channel clock CLK815.

The bus clock operates 10% of channel operation time. The registers operated with the bus clock consume:

(40% of channel area operating according to the bus clock/10% bus operation time)/

(60% of channel area operating according to the channel clock/100%) = 6.6% of total channel energy Respectively, the channel part operated with the channel clock CLK705 consumes 93.4% total energy.

Let us calculate what part of total energy consumes 1% of channel area operated according to the channel clock:

(Channel clock operating part consumes 93.4%/60% of channel area operating according to channel clock)=1.55666%

And, finally, circuit that consumes the CLK815 divided clock-operating channel part:

1.55666% of total consumption*59% of area=91.8433% of total channel consumption.

The above calculations have shown that for this example:
clock division by 2 in the channel 109 results in half of the power consumption;
If the channel clock is divided by 4, power consumption in the channel 109 falls by almost a factor of 4;
If the channel clock is divided by 8, power consumption in the channel 109 falls by almost a factor of 8;
And if the channel clock is divided by 16, power consumption in the channel 109 falls by almost a factor of 16.

Figure 9:
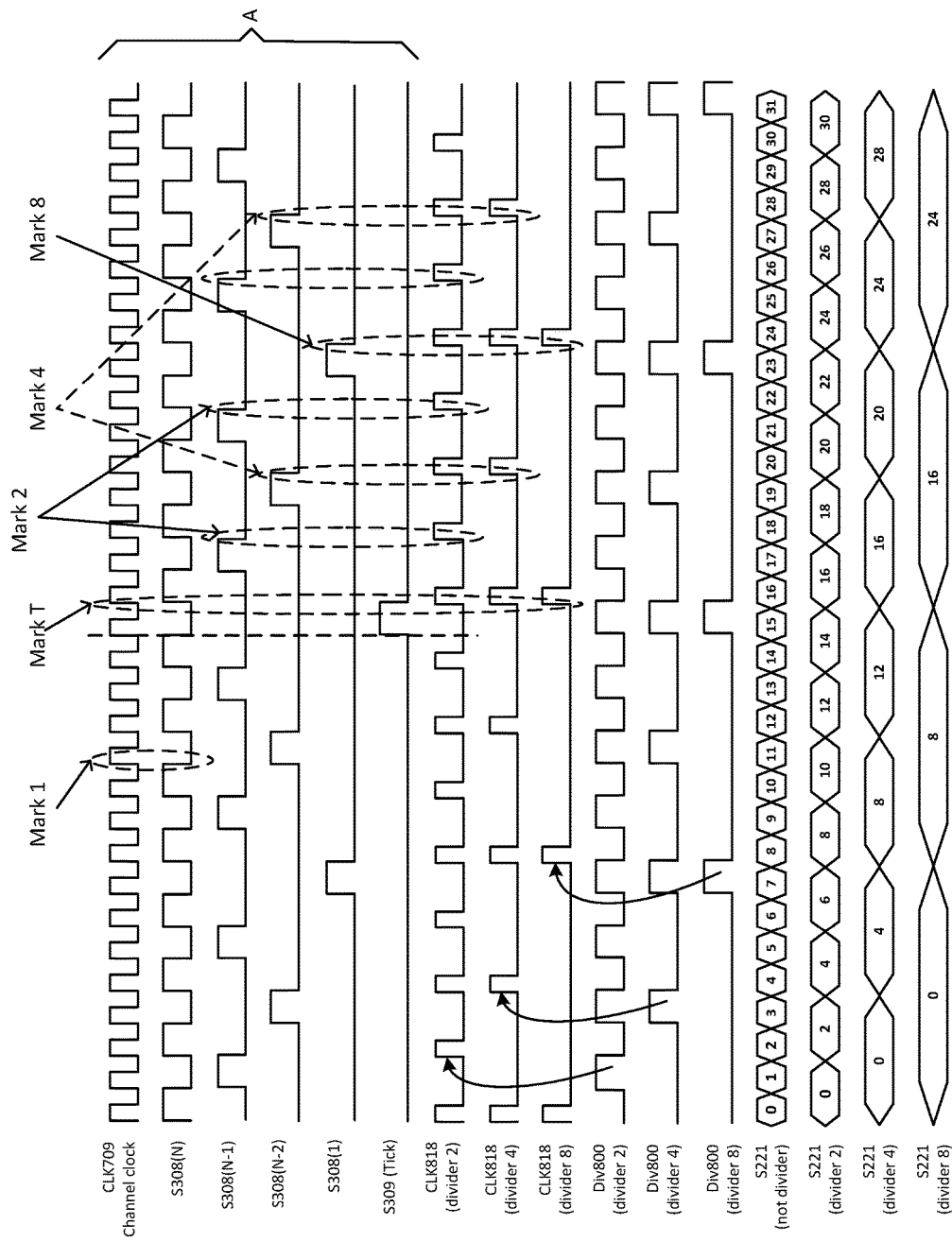
FIG. 9 illustrates signal division in a new channel depending on selected division coefficient.

Signal division in a new channel depending on selected division coefficient FIG. 9, where:
MarkT—S308(N) and S309 are used for CLK709;
Mark1—S308(N) are used for CLK709;
Mark2—S308(N-1) used when selecting division by 2 of CLK709;
Mark4—S308(N-2) used when selecting division by 2 and 4 of CLK709;
Mark8—S308(1) used when selecting division by 2, 4 and 8 of CLK709.

When CLK709 is not divided, the channel 109 uses S309, S308(N), S308(N-1), S308(N-2) ... S308(1). When selecting division by 2, the channel 109 uses S309, S308(N-1), S308(N-2) ... S308(1). When selecting division by 4, the channel 109 uses S309, S308(N-2) ... S308(1). When selecting division by 8, the channel 109 uses S309, 308(1).

Having thus described the different embodiments of a system and method, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. A method for receiving and processing satellite navigation signals, comprising:
receiving the satellite navigation signals in a plurality of RF paths and converting them to digital signals;
providing a clock signal to all channels that process the digital signals;
generating enable frequency division signals;
for each channel, selecting a channel enable frequency division signal from the enable frequency division signals to match a spectrum bandwidth of an RF path of the each channel;
connecting the each channel to its Analog-to-Digital Converter;
for each channel, downsampling an output of its corresponding Analog-to-Digital Converter based on the selected enable frequency division signal, to produce a downsampled digital signal;
generating a code frequency signal and a base carrier frequency signal using a net accumulation signal;
processing the downsampled digital signal in each channel to produce digital quadrature signal components of the downsampled digital signal based on the code frequency signal and the base carrier frequency signal;
using a tick signal, which has a pulse at a frequency of the clock signal divided by $2^N$ (N>0) based on the enable frequency division signal, for timing the downsampled digital signals in the channels and to define a time for determining digital signal phase differences between the channels, so that a frequency of operations in the channels is reduced by a factor of $2^N$; and
outputting coordinates based on the digital quadrature signal components and the determined digital signal phase differences.

2. The method of claim 1, wherein the digital signals are received using multiple antennas and are processed using multiple corresponding RF paths.

3. The method of claim 1, wherein the channel frequency is divided by $2^N$ using the enable frequency division signal.

4. The method of claim 1, wherein each channel receives multiple enable frequency division signals.

5. The method of claim 1, wherein upon receipt of the enable frequency division signal and the channel clock into a clock gate, the clock gate outputs a divided channel clock.

6. The method of claim 1, wherein, for any selected enable frequency division signal, the tick signal is used as a temporary time scale, for determining a phase difference between a carrier frequency generator and a code frequency generator in all the channels and for synchronous start of the generators.

7. The method of claim 1, wherein all the channels are divided into groups, each group having its own clock tree of the processor and of the channel.

8. The method of claim 7, wherein, if none of the channels in a particular group are used to process a signal from a satellite, then a channel clock and a processor clock for that group is turned off.

9. A system for receiving and processing satellite navigation signals, comprising:

an antenna receiving the satellite navigation signals and feeding the satellite navigation signals into a plurality of RF paths;

a plurality of Analog-to-Digital Converters, wherein each RF path is connected to one Analog-to-Digital converter to output a corresponding digitized satellite navigation signal;

a generator of a plurality of enable frequency division signals;

a plurality of channels that process the digitized satellite navigation signals;

a clock signal provided to the plurality of channels;

wherein, for each channel, a selected channel enable frequency division signal from the enable frequency division signals matches a spectrum bandwidth of an RF path of the each channel;

wherein, for each channel, an output of its corresponding Analog-to-Digital Converter is downsampled based on the selected enable frequency division signal, to produce a downsampled digital signal;

a generator of a code frequency signal and a base carrier frequency signal;

wherein each channel produces digital quadrature signal components of the downsampled digital signal based on the code frequency signal and the base carrier frequency signal;

wherein each channel uses a tick signal that has a pulse at a frequency of the clock signal divided by $2^N$ (N>0) based on the enable frequency division signal, for timing the downsampled digital signals in the channel and to define a time for determining digital signal phase differences between the channels, so that a frequency of operations in the channels is reduced by a factor of $2^N$; and wherein coordinates are outputted by the system based on the digital quadrature signal components and the determined digital signal phase differences.

10. The system of claim 9, wherein the digital signals are received using multiple antennas and are processed using multiple corresponding RF paths.

11. The system of claim 9, wherein the channel frequency is divided by $2^N$ using the enable frequency division signal.

12. The system of claim 9, wherein each channel receives multiple enable frequency division signals.

13. The system of claim 9, wherein upon receipt of the enable frequency division signal and the channel clock into a clock gate, the clock gate outputs a divided channel clock.

14. The system of claim 9, wherein, for any selected enable frequency division signal, the tick signal is used as a temporary time scale, for determining a phase difference between a carrier frequency generator and a code frequency generator in all the channels and for synchronous start of the generators.

15. The system of claim 9, wherein all the channels are divided into groups, each group having its own clock tree of the processor and of the channel.

16. The system of claim 15, wherein, if none of the channels in a particular group are used to process a signal from a satellite, then a channel clock and a processor clock for that group is turned off.

* * * * *